United States Patent
Wu et al.

(10) Patent No.: US 12,306,674 B2
(45) Date of Patent: May 20, 2025

(54) INFORMATION HANDLING SYSTEM INTERNAL COMPONENT PART STORAGE

(71) Applicant: Dell Products L.P., Round Rock, TX (US)

(72) Inventors: Jing-Tang Wu, Taipei (TW); Bo-Wei Chu, Taipei (TW); Hui-Huan Chien, Taipei (TW)

(73) Assignee: Dell Products L.P., Round Rock, TX (US)

( * ) Notice: Subject to any disclaimer, the term of this patent is extended or adjusted under 35 U.S.C. 154(b) by 143 days.

(21) Appl. No.: 18/228,618

(22) Filed: Jul. 31, 2023

(65) Prior Publication Data

US 2025/0044839 A1 Feb. 6, 2025

(51) Int. Cl.
*G06F 1/16* (2006.01)
*H05K 5/00* (2025.01)
*H05K 7/00* (2006.01)
*H05K 7/14* (2006.01)

(52) U.S. Cl.
CPC ......... *G06F 1/1658* (2013.01); *H05K 7/1407* (2013.01)

(58) Field of Classification Search
CPC ...... G06F 1/1656; G06F 1/1658; G06F 1/166; H05K 7/1407; H05K 7/1408; H05K 7/1409; H05K 7/1411; H05K 7/1405; H05K 7/1404; H05K 7/1402; H05K 7/1401
See application file for complete search history.

(56) References Cited

U.S. PATENT DOCUMENTS

| | | | |
|---|---|---|---|
| 9,128,662 B2 | 9/2015 | Kim et al. | |
| 10,140,063 B2 | 11/2018 | Worley et al. | |
| 10,862,190 B1 * | 12/2020 | Ramasamy | G06F 1/1688 |
| 10,996,896 B2 | 5/2021 | Worley et al. | |
| 11,311,114 B1 | 4/2022 | Fleisher et al. | |
| 11,740,707 B1 * | 8/2023 | Files | H04R 1/028 345/168 |
| 12,216,512 B2 * | 2/2025 | Morrison | G06F 1/184 |
| 2017/0220265 A1 | 8/2017 | Shu et al. | |
| 2021/0011529 A1 * | 1/2021 | Escamilla | G06F 1/186 |
| 2021/0226876 A1 | 8/2021 | Ponnuru et al. | |
| 2021/0242565 A1 * | 8/2021 | Kim | H01Q 21/065 |
| 2021/0242566 A1 * | 8/2021 | Kim | H01Q 1/521 |
| 2021/0247821 A1 * | 8/2021 | Henderson | G11B 33/027 |
| 2022/0344825 A1 * | 10/2022 | Ramasamy | H01Q 13/10 |
| 2023/0073644 A1 | 3/2023 | Thakkar et al. | |
| 2024/0201735 A1 * | 6/2024 | Tsen | G06F 1/1616 |
| 2024/0204387 A1 * | 6/2024 | Files | H01Q 1/02 |
| 2024/0206113 A1 * | 6/2024 | Morrison | G06F 1/20 |

* cited by examiner

*Primary Examiner* — Anthony M Haughton
(74) *Attorney, Agent, or Firm* — Zagorin Cave LLP; Robert W. Holland

(57) ABSTRACT

An information handling system housing includes an interior frame that integrates removeable slot adapters and a garage to hold the slot adapters once separate from the frame. In one example embodiment, a slot adapter has plural support structures and screw openings with an offset bottom surface alignment pin so that insertion into openings in different device slots will support different types of devices, such as solid state drives (SSDs) and wireless network interface controllers.

20 Claims, 11 Drawing Sheets

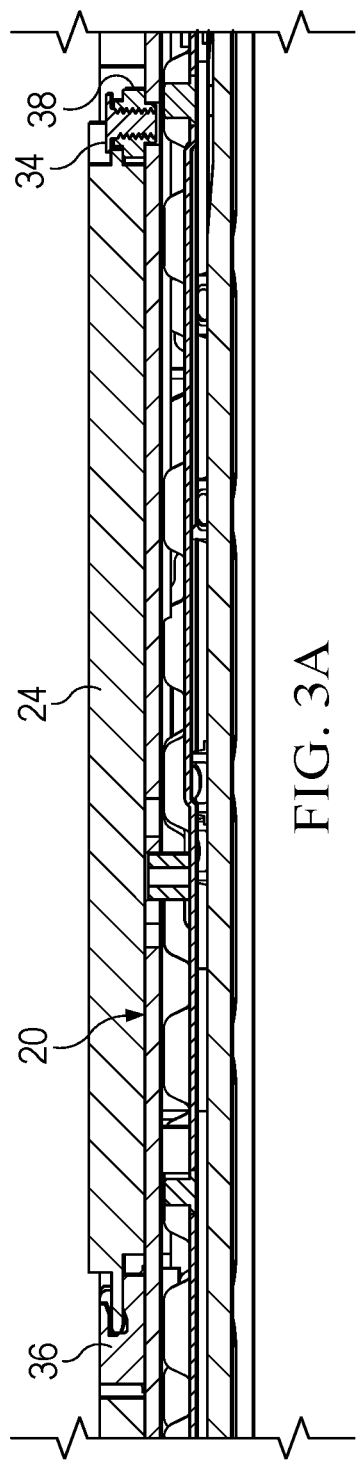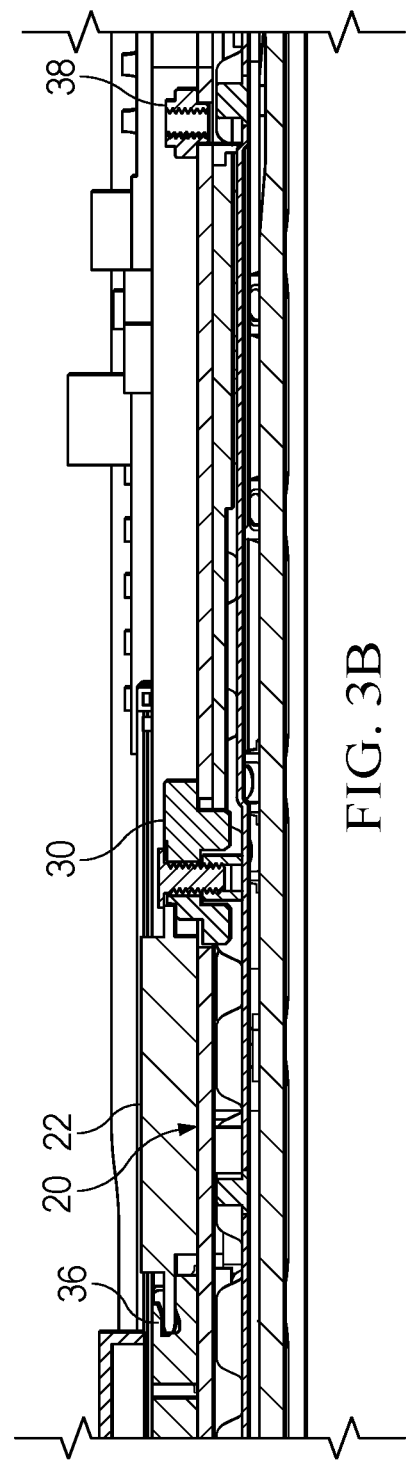

INFORMATION HANDLING SYSTEM INTERNAL COMPONENT PART STORAGE

BACKGROUND OF THE INVENTION

Field of the Invention

The present invention relates in general to the field of information handling system internal components, and more particularly to an information handling system internal component part storage.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that couple to each other so that the system converts between closed and open positions. For example, a main housing portion integrates processing components and a keyboard and rotationally couples with hinges to a lid housing portion that integrates a display. In clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

Generally, portable information handling systems are built with interchangeable components so that a system can be built to adapt to a particular end user's needs. For example, solid state drives (SSD) come in a variety of storage sizes, determined by the storage capacity of flash integrated circuits within the drives, and also drive footprint sizes. Two common SSD configurations include 2230 and 2280 internal M.2 cards. Both SSD configurations have a 22 mm width with an M.2 connector at one side, the 2230 configuration has a 30 mm length and the 2280 has an 80 mm length. The 2230 configuration can fit into a smaller space, but the 2280 configuration holds a greater number of memory integrated circuits to store information. When a 2280 M.2 slot is available, an end user can typically choose to populate the slot with a 2230 configuration SSD provides the shorter end has a separate connector to hold it in place. Similarly, wireless wide area network (WWAN) cards come in different dimensions, such as 3042 or 30×42 mm, that support different types of network interfaces, such as 4G versus 5G. Although the different sized cards typically share a similar connector, such as an M.2 connector, the different footprints often mean that small sized cards couple into the housing with additional connectors.

Although portable information handling systems offer end users flexibility in adapting their system to different needs with different components, end users still face difficulty finding connectors that will hold the components in the component slots. If a connector is not available, the attempt to install the component will fail. Often an end user will not know what type of connector is needed to install a component until the system is open and the component slot is exposed. This provides a poor end user experience and, when the correct connector is not available, can lead to a failed installation.

SUMMARY OF THE INVENTION

Therefore, a need has arisen for a system and method which removably integrates slot adapters in an internal frame of an information handling system housing that separate to support different types of devices coupling into different types of device slots.

In accordance with the present invention, a system and method are provided which substantially reduce the disadvantages and problems associated with previous methods and systems for coupling devices in device slots of an information handling system. Device slot adapters separate from a frame and install in a device slot to adapt the device slot to one or more predetermined devices. When a separated slot adapter is not in use, a slot adapter garage accepts the device slot adapter to hold internal within the information handling system housing until needed.

More specifically, an information handling system processes information with a processor and memory coupled to a motherboard having plural device slots configured to couple to different types of devices, such as solid state drives and wireless network interface controllers. A frame included in the interior of the information handling system housing has removeably integrated slot adapters that separate from the frame to place in a device slot with a support surface configured to adapt the device slot to accept one or more different types of devices. In one example embodiment, the slot adapter has plural screw openings and an offset alignment post that inserts in post openings at different positions of the device slot to configure the device slot for devices of different types of footprints.

The present invention provides a number of important technical advantages. One example of an important technical advantage is that a frame internal to an information handling system housing includes device slot adapters that separate and place in device slots to adapt the device slots to accept devices of different footprints. An end user has the slot adapter readily available when the housing is open to expose the device slot so that all parts are ready to install a device. A separated slot adapter is stored in a slot adapter garage when not in use in the event the slot adapter is needed at a later time. In one example embodiment, the slot adapter includes plural support structures that adapt the device slot to plural types of devices. This multiple device capability can reduce the number of slot adapters held within the housing and allow duplicates of the same type of slot adapter to help ensure that a slot adapter is available for each type of device supported by the information handling system.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 3A and 3B depict a side sectional view of a 2280 SSD device and a 2230 SSD device coupled in a device slot;

DETAILED DESCRIPTION

An information handling system housing interior has a frame with releasably integrated slot adapters that separate to support devices in device slots. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
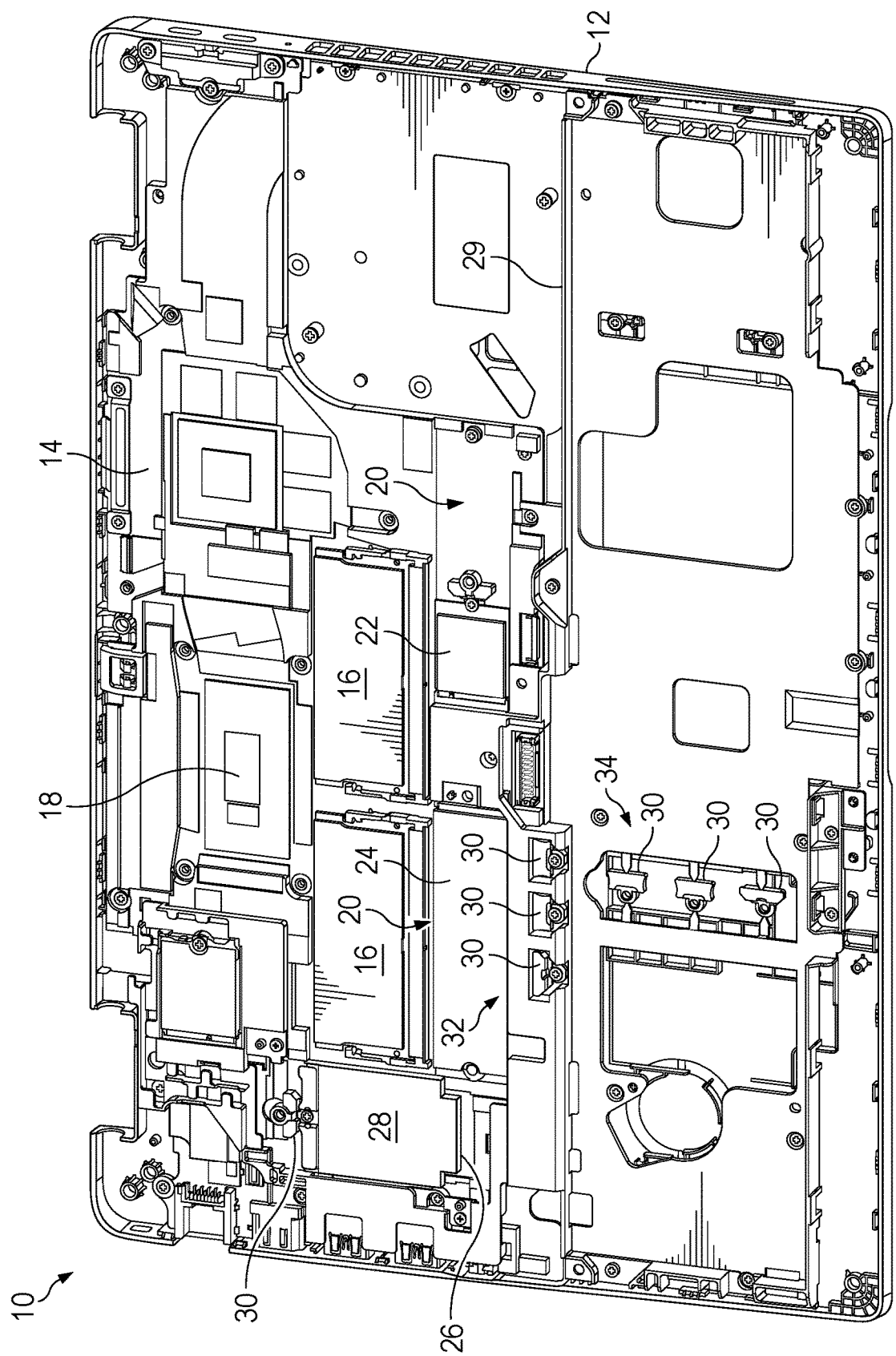
FIG. 1 depicts an upper perspective view of an information handling system housing interior having a frame that releasably couples device slot adapters separable to support a device in a device slot.

Referring now to FIG. 1, an upper perspective view depicts an information handling system 10 housing 12 interior having a frame 29 that releasably couples device slot adapters 30 separable to support a device in a device slot. In the example embodiment, housing 12 is a main housing portion of a portable information handling system having a motherboard 14 that supports communication between processing components, such as central processing unit (CPU) 18 that executes instructions to process information and a random access memory (RAM) 16 that stores the instructions and information. Motherboard 14 includes plural device slots that accept devices to communicate with CPU 18 to support processing functions. For example, plural solid state drive (SSD) M.2 slots 20 are configured to accept SSD devices having an M.2 interface that support persistent storage of information. As another example, plural wireless network interface controller (WNIC) slots 26 have an interface that supports communication with 4G and 5G WWAN cards. SSD M.2 slots 20 have a footprint that accepts a 2280 SSD device 24 and can also accept the shorter length of a 2230 SSD device 22. WNIC slot 26 accepts a WWAN card 28 that can vary in footprint based on whether the supported WWAN card is 4G or 5G compliant.

Although the interfaces of SSD M.2 slot 20 and WNIC slot 26 with provide signaling to devices of different types, the slot footprint is typically sized for the greatest possible device area so that connection points within the device slots will not necessarily fit with different sized devices. In order to adapt each device slot to different types of devices, plural slot adapters 30 are releasably integrated with frame 29 so that an end user can snap a slot adapter 30 free and use the slot adapter when needed. For instance, frame 29 is injection molded hard plastic with the slot adapters included and integrated at thin breakable structures. When an end user desires to use a slot adapter 30 within a new slot adapter holder 34, the end user twists the slot adapter free and places the slot adapter in the desire device slot. If a slot adapter 30 is removed from a device slot, a slot adapter garage 32 formed in frame 29 accepts the slot adapter, such as with a snap connection, to hold the slot adapter until it is needed. Frame 29 fits within the interior or housing 12 to hide the slot adapters when the housing is closed and expose the slot adapters when the housing is opened, such as is typical when an end user inserts a new device in a device slot.

Figure 2A:
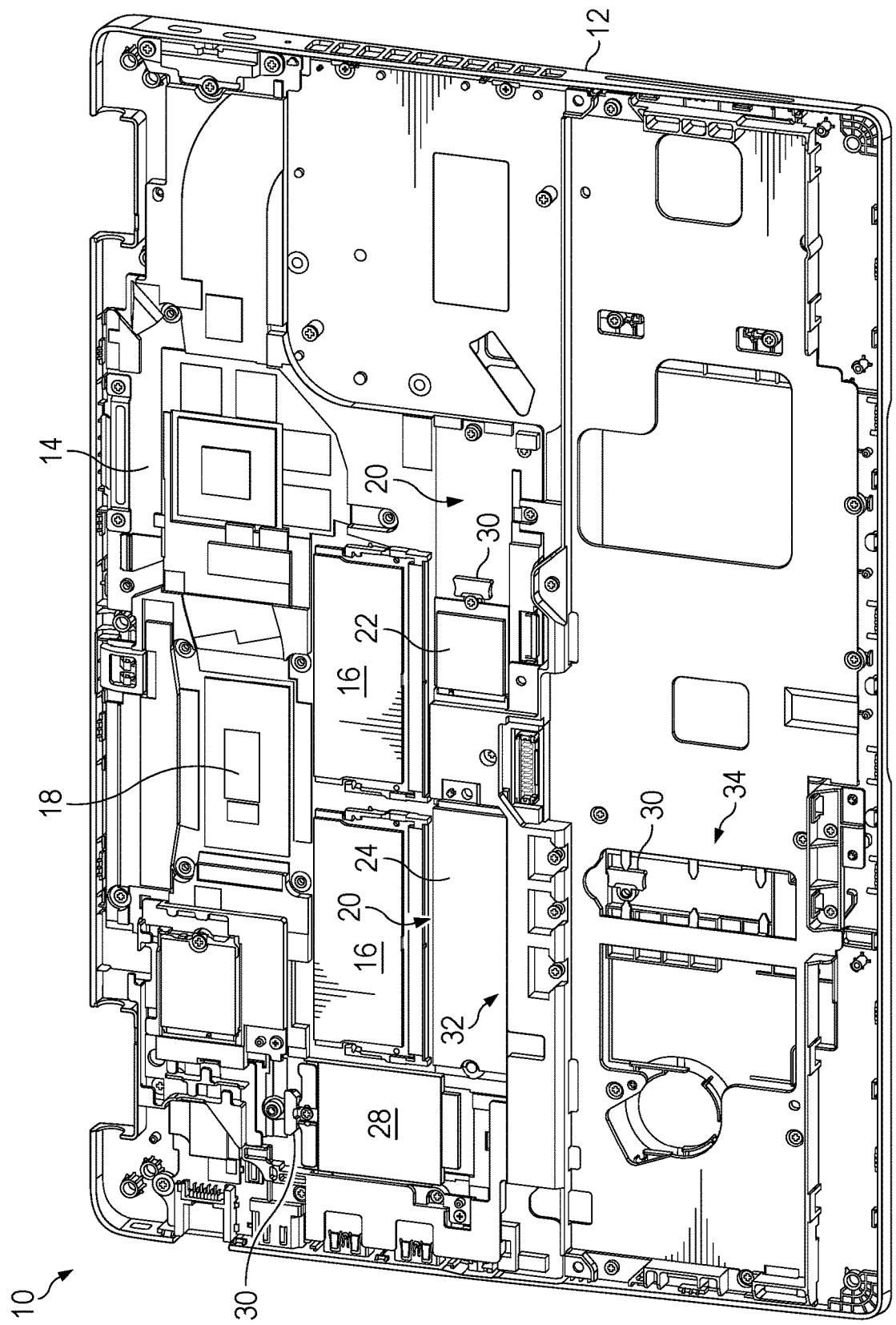
FIGS. 2A and 2B depict an example embodiment having devices swapped with the aid of slot adapters.
Figure 2B:
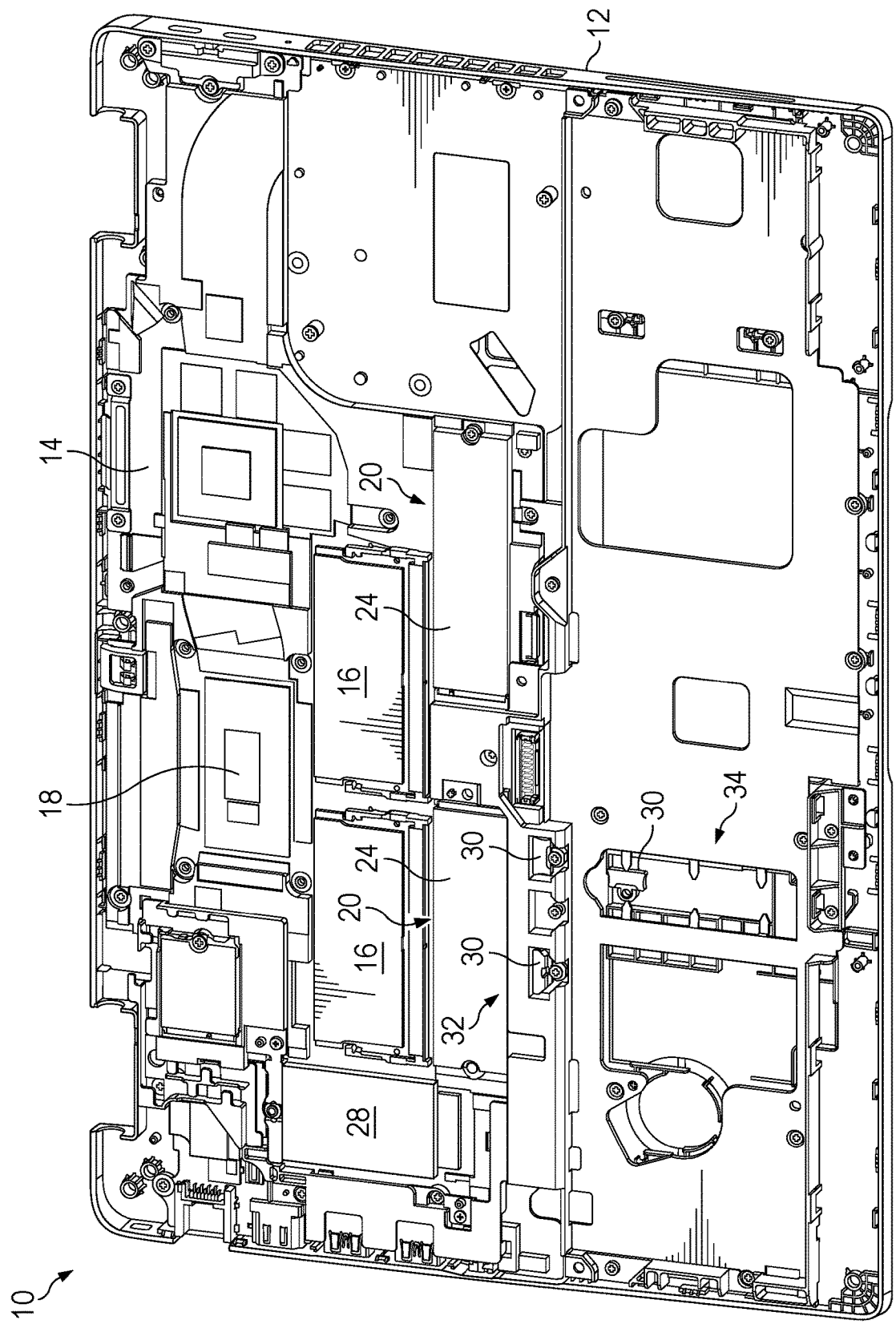

Referring now to FIGS. 2A and 2B, an example embodiment depicts devices swapped with the aid of slot adapters 30. FIG. 2A depicts a 2230 SSD device 22 coupled to an SSD device slot with a first slot adapter 30 and a 4G WNIC device 28 coupled to a WNIC slot 26. The 2230 SSD device and 4G WNIC device have a smaller footprint than the 2280 SSD device and 5G WNIC device that are also supported by device slots 20 and 26 respectively. To couple the 2230 SSD device and 4G WNIC device into their respective device slot, a slot adapter specific to each is separated from new slot adapter holder 34 and placed in the associated device slot where the device is coupled in place by a screw. FIG. 2B depicts a replacement of the of the 4G WNIC with a 5G WNIC 28 and a replacement of the 2230 SSD with a 2280 SSD 24. In the example embodiment, the slot adapters 30 that were used for the 4G WNIC and the 2230 SSD are snapped into place in slot adapter garage 32. The new devices may be coupled into place with or without the use of a slot adapter, depending upon the configuration of the underlying motherboard. More specific examples are depicted below.

Referring now to FIGS. 3A and 3B, a side sectional view depicts a 2280 SSD device 24 and a 2230 SSD device 22 coupled in a device slot 20. FIG. 3A depicts 2280 SSD device 24 fit into a device slot 20 defined on the motherboard or another circuit board and having an M.2 connector interface 36 on a left side. Opposite connector interface 36, an opening in the end of SSD device 24 accepts a screw 34 on a threaded post 38. FIG. 3B depicts 2230 SSD device 22 having a shorter length with an adapter 30 at an end position that accepts a screw 34 inserted into threads formed at the motherboard in the bottom surface of device slot 20. Adapter 30 has a raised surface on which the end of 2230 SSD 22 rests to hold the device level. Adapter 30 used to hold the shorter 2230 SSD in place is removed when the longer 2280 SSD is fit into the full length of the device slot 20. In the example embodiment of FIGS. 3A and 3B, the 2280 SSD device couples into the device slot without the use of a separate adapter.

Figure 4:
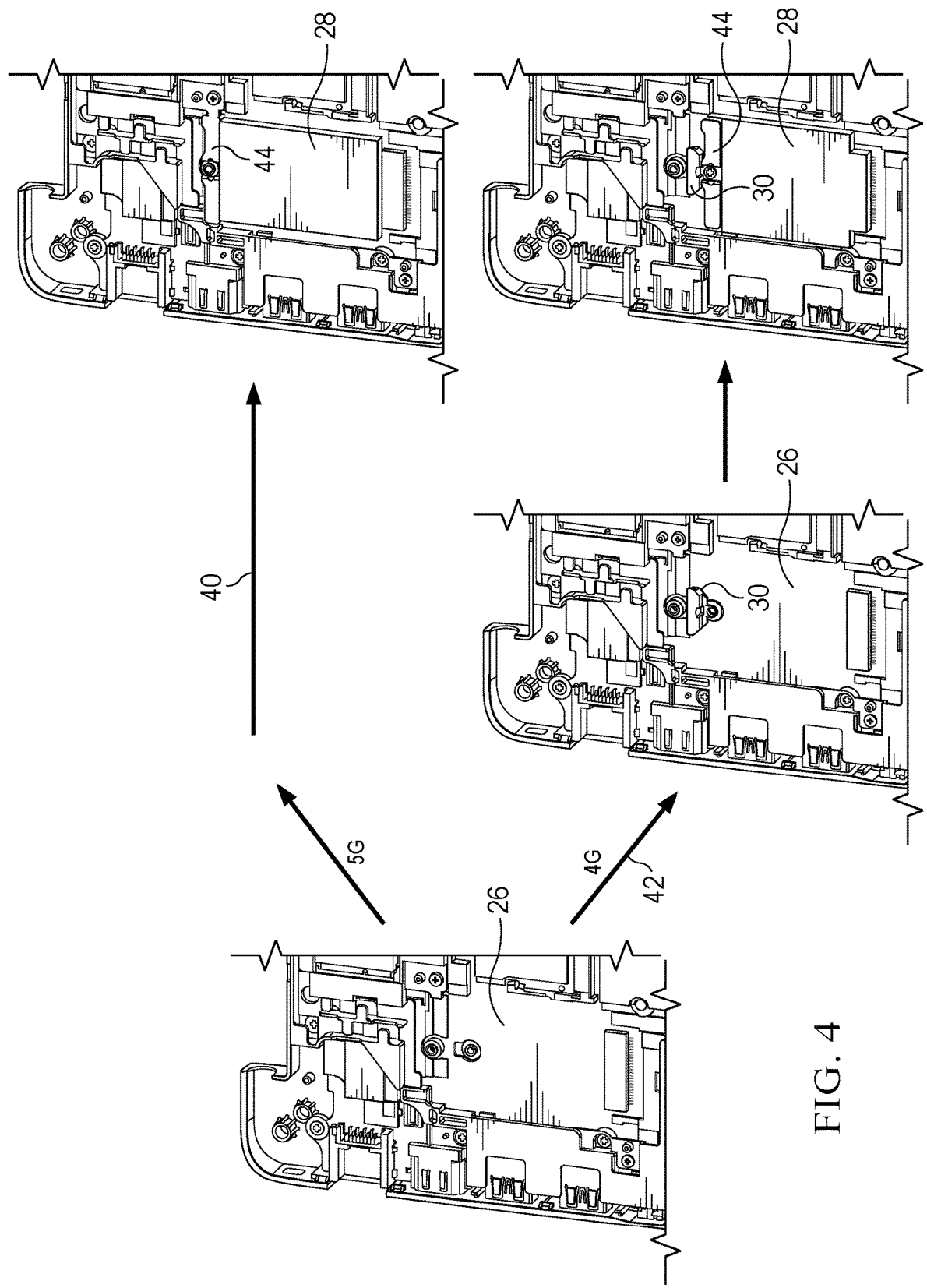
FIG. 4 depicts selection of a 4G versus 5G WNIC to couple to a WNIC device slot.

Referring now to FIG. 4, selection of a 4G versus 5G WNIC is depicted to couple to a WNIC device slot 26. At arrow 40 a 5G WNIC 28 couples directly to a bracket 44 opposite the signal interface. Bracket 44 screw inserts through to engage threads in the motherboard. At arrow 42, a slot adapter 30 couples to the WNIC device slot 26 at the bracket location with a first screw through the motherboard. Slot adapter 30 has a threaded insert in a position that will couple the 4G WNIC in place with the signal interface engaged. When 4G WNIC device 28 couples into WNIC device slot 26, the end rests on slot adapter 30 with the device screw opening aligned to the slot adapter threaded opening. The effect is to couple 4G WNIC device into a 5G footprint by having slot adapter 30 compensate for the shorter length of the 4G WNIC device 28.

Figure 5A:
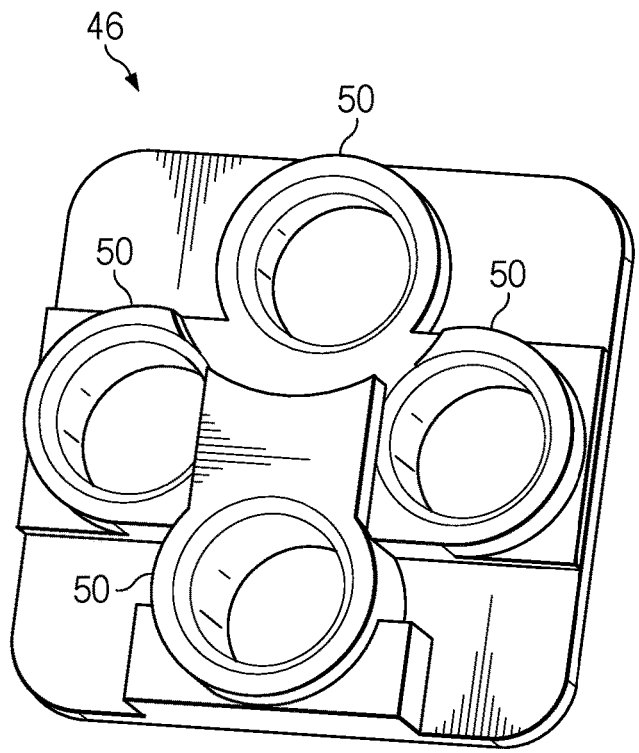
FIGS. 5A and 5B depict an alternative embodiment of a slot adapter having plural device screw openings and support structures.
Figure 5B:
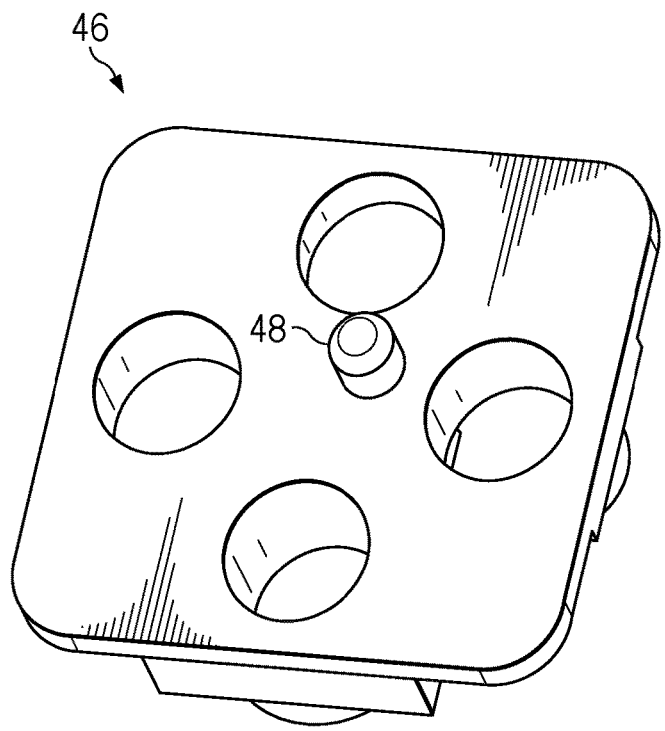

Referring now to FIGS. 5A and 5B, an alternative embodiment of a slot adapter 46 depicts plural device screw openings and support structures 50. FIG. 5A depicts a top view of the slot adapter 46 with four screw openings that selectively align with a screw insert of a motherboard based upon the orientation of the slot adapter in the device slot. Structures 50 associated with each screw opening are positioned so that a device supported by a screw opening will have support as needed from the adapter, such as based upon the lower surface of the device where it couples to the motherboard. FIG. 5B depicts a bottom side of slot adapter 46 having an alignment pin 48 that extends down from the bottom surface and sized to engage an opening in a motherboard. Alignment pin 48 is offset from center so that insertion in a motherboard will place one screw opening in alignment with the threaded stud of the motherboard. In this manner, each device will align the appropriate screw opening with the motherboard screw opening when placed in a position in a device slot associated with a predetermined device. The placement of slot adapter 46 for different devices is shown as examples in FIGS. 6A, 6B, 7A and 7B as described in greater detail below.

Figure 6A:
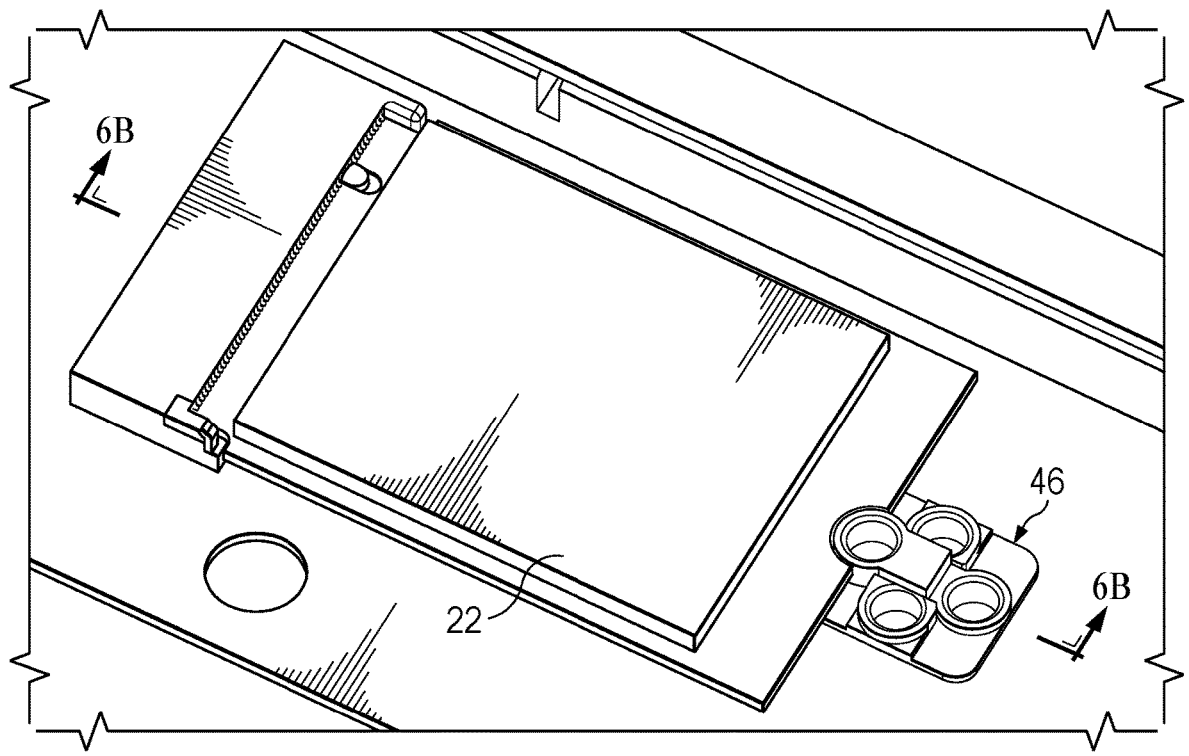
FIGS. 6A and 6B depict a 2230 SSD device coupled to a motherboard with a slot adapter configured for use with plural device slots.
Figure 6B:
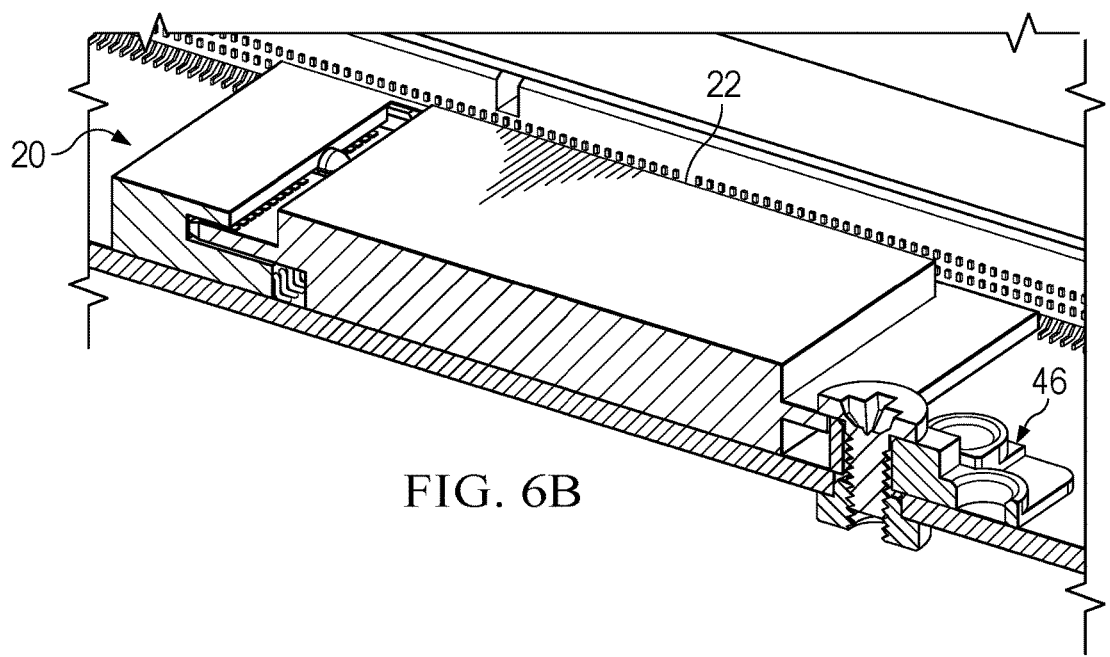

Referring now to FIGS. 6A and 6B, a 2230 SSD device 22 is depicted coupled to a motherboard with a slot adapter 46 configured for use with plural device slots. FIG. 6A depicts SSD device 22 inserted into the signal interface and having slot adapter 46 with one screw opening aligned to fit over the opposing end at the screw insertion point of the SSD device. FIG. 6B depicts a sectional view of the SSD device 22 having a screw inserted through the SSD device and slot adapter screw openings and engaged with threads of the motherboard. The upper surface of slot adapter 46 supports the lower surface of the SSD device to hold the SSD device level and in position to engage the motherboard.

Figure 7A:
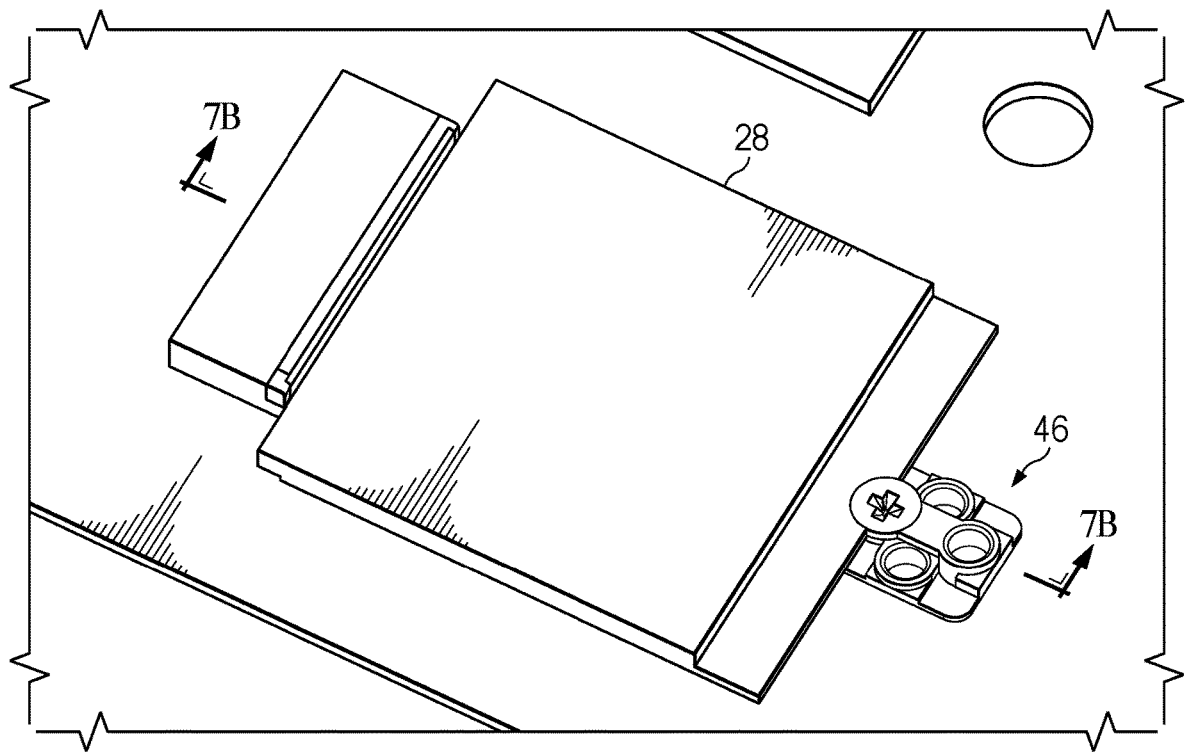
FIGS. 7A and 7B depict a 3042 4G WNIC device coupled to a motherboard with a slot adapter configured for use with plural device slots.
Figure 7B:
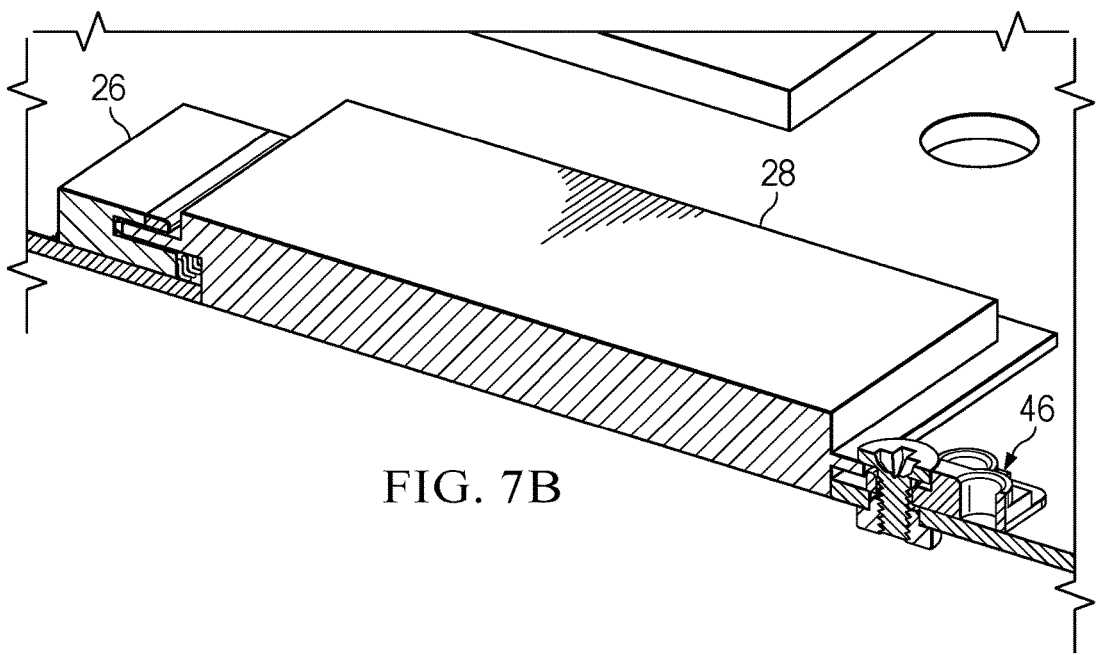

Referring now to FIGS. 7A and 7B, a 3042 4G WNIC device 28 is depicted coupled to a motherboard with a slot adapter 46 configured for use with plural device slots. Slot adapter 46 is rotated relative to the alignment depicted by FIGS. 6A and 6B so that the screw opening of slot adapter 46 associated with a WNIC card is aligned with the threaded opening in the motherboard. FIG. 7A depicts a top view of the slot adapter 46 with a screw inserted through the opening and coupling the WNIC device in place. FIG. 7B depicts a sectional view of WNIC device 28 illustrating coupling to the motherboard with the screw through the screw opening and support by structures of slot adapter 46 to hold WNIC device 28 in position with the signaling interface connected.

Figure 8A:
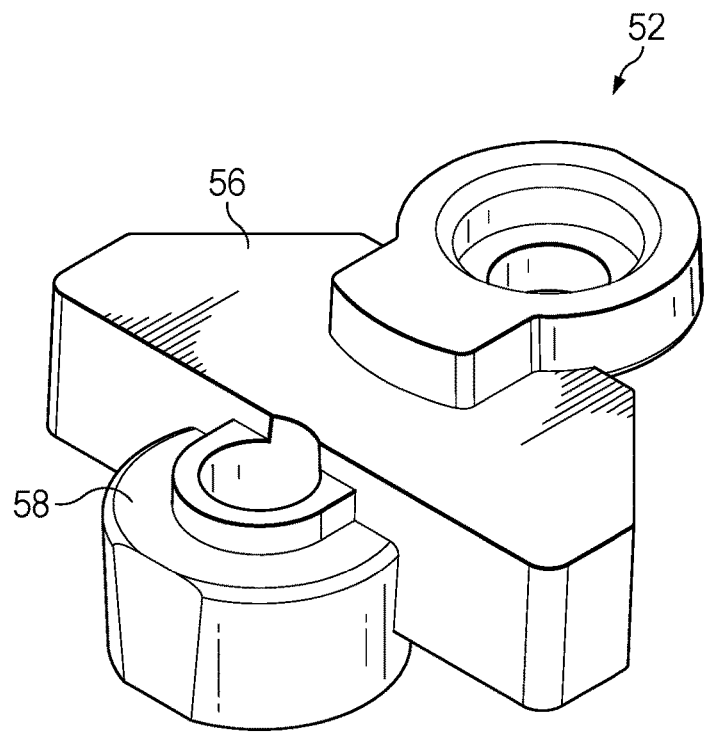
FIGS. 8A and 8B depict a two-device slot adapter that manages coupling of either an SSD device or a WNIC device.
Figure 8B:
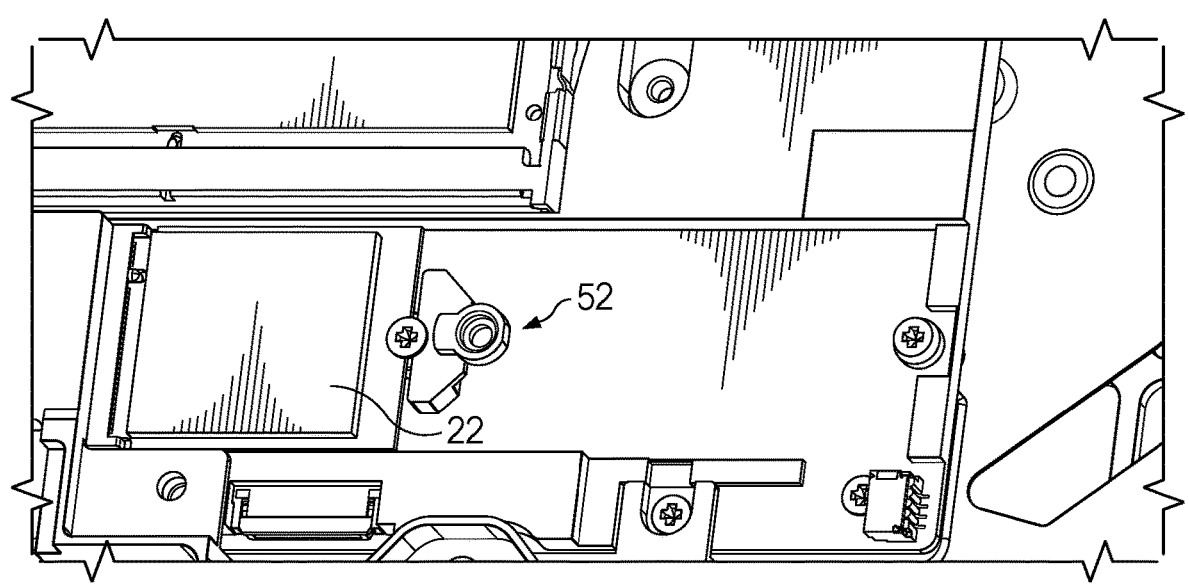

Referring now to FIGS. 8A and 8B, a two-device slot adapter 52 is depicted that manages coupling of either a SSD device 22 or a WNIC device 28. FIG. 8A is a perspective view of the two-device slot adapter 52 in an upright position that is configured to support a 2230 SSD with an upper support surface 56 and a screw opening support surface 58. Support surface 56 has a height appropriate to couple a WNIC device when the slot adapter is inverted. FIG. 8B depicts the 2230 SSD device 22 coupled into the device slot with a screw inserted through the opening and the screw opening support surface 58 providing a standoff height above the device slot surface associated with SSD device coupling.

Figure 9A:
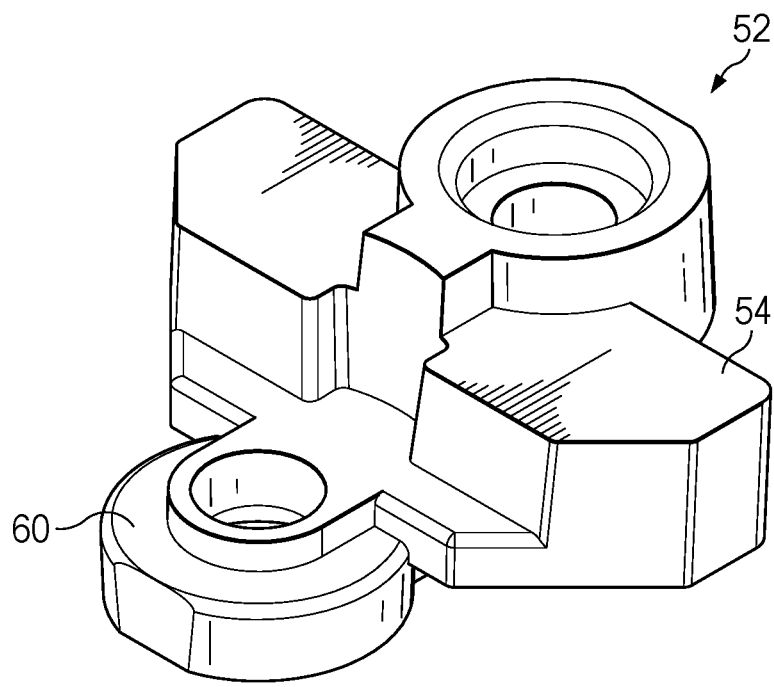
FIGS. 9A and 9B depict the two-device slot adapter that manages coupling of either an SSD device or a WNIC device.
Figure 9B:
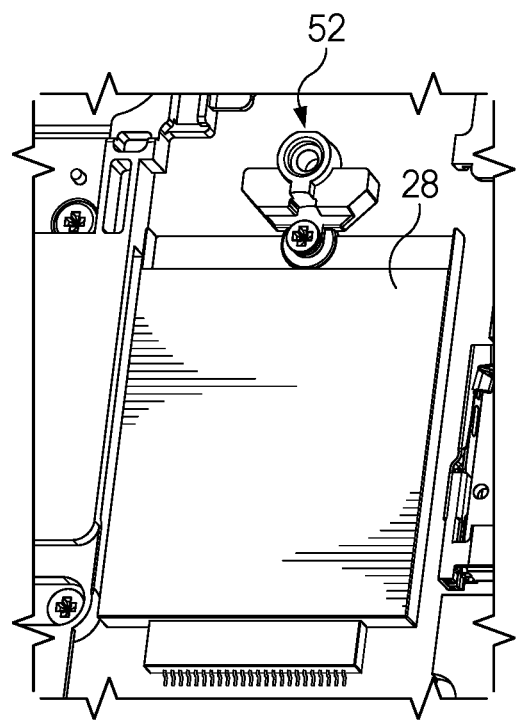

Referring now to FIGS. 9A and 9B, the two-device slot adapter 52 is depicted that manages coupling of either an SSD device 22 or a WNIC device 28. FIG. 9A is a perspective view of the two-device slot adapter 52 in an inverted position (relative to FIG. 8A) that is configured to support a 3042 WNIC device 28. An upper surface 54 has a height appropriate for coupling an SSD device in place when the slot adapter is upright. Screw opening support surface 60 is positioned in the inverted configuration to rest under a WNIC device. FIG. 9B depicts the WNIC device 28 couple in the device slot with a screw holding the device in place.

Figure 10:
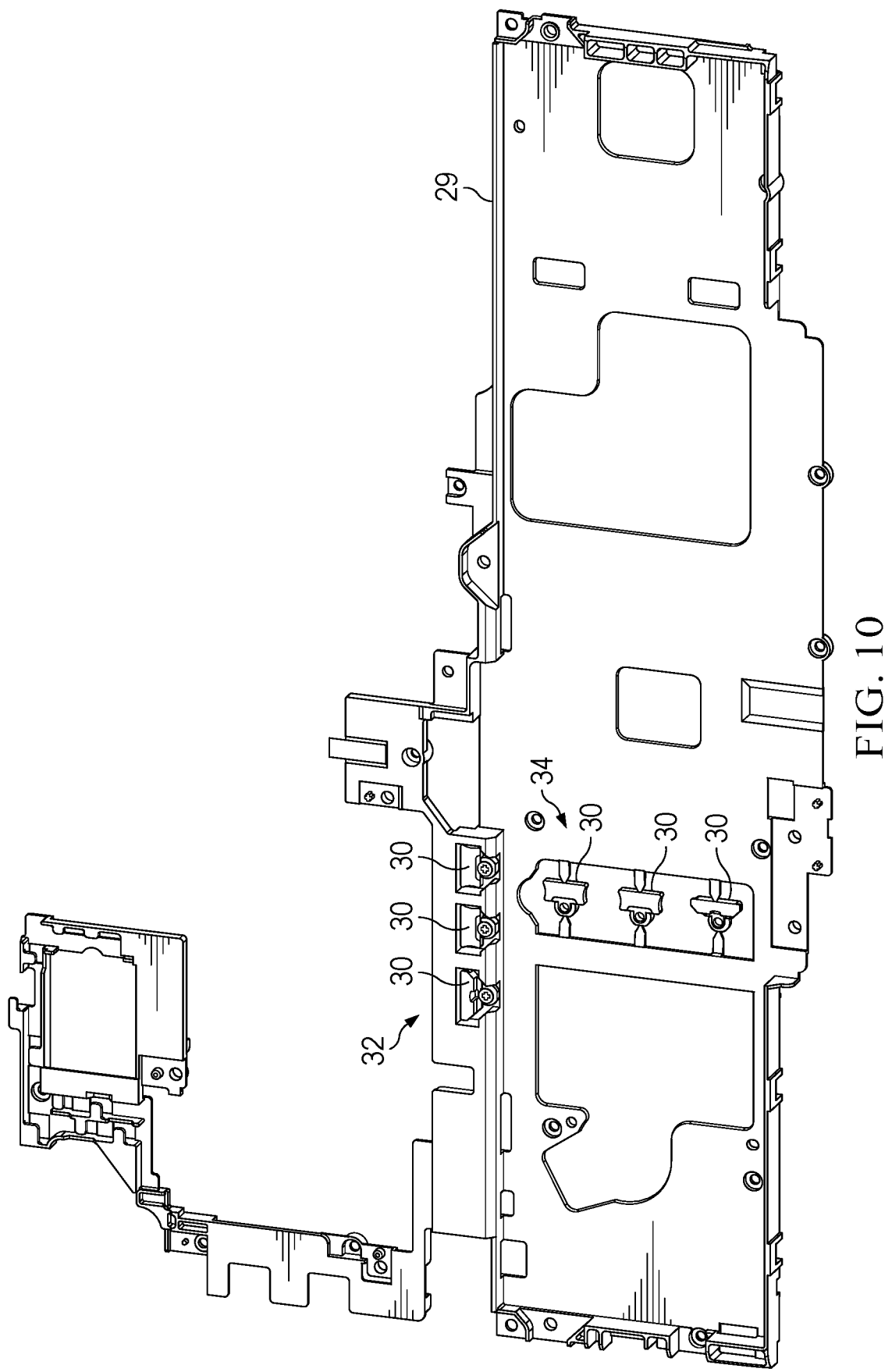
FIG. 10 depicts an upper perspective view of a frame that inserts in a housing interior and removably integrates plural slot adapters.

Referring now to FIG. 10, an upper perspective view depicts a frame that inserts in a housing interior and removably integrates plural slot adapters. Frame 29 is a single piece of hard plastic injection molded to fit in the housing, such as to hold various components in place within the housing interior. Slot adapters 30 integrate as a contiguous piece with the frame in the new slot adapter holder 34. When a slot adapter 30 is needed to couple a device in a device slot, it is broken free from the supporting plastic. Slot adapter garage 32 holds slot adapters 30 that have been separated when the slot adapters are not in use.

Although the present invention has been described in detail, it should be understood that various changes, substitutions and alterations can be made hereto without departing from the spirit and scope of the invention as defined by the appended claims.

What is claimed is:

1. An information handling system comprising:
 a housing;
 a motherboard;
 a processor coupled to the motherboard and operable to execute instructions that process information;
 a memory coupled to the motherboard and interfaced with the processor, the memory operable to store the instructions and information;

a device slot defined on the motherboard and configured to accept a first device having a first footprint and a second device having a second footprint; and a frame coupled to the housing and including a slot adapter separably coupled, the slot adapter configured to separate from the frame and couple at the device slot to adapt the device slot to the second footprint.

2. The information handling system of claim 1 wherein:

the first device comprises a 2280 solid state drive (SSD) having a signal interface at a first end and a screw opening at a second end opposite the first end; and the second device comprises a 2230 SSD having the signal interface at a first end and the screw opening at a second end, the slot adapter having an opening to accept a screw and a structure to elevate the second device over the device slot.

3. The information handling system of claim 2 wherein:

the device slot has a standoff with a height at the 2280 SSD second end; and the slot adapter has the height to hold the 2230 SSD in the device slot.

4. The information handling system of claim 3 wherein the slot adapter has a first structure with the height configured to adapt the device slot for the 2230 SSD and a second structure configured to adapt another device slot to couple a wireless network interface controller card (WNIC).

5. The information handling system of claim 2 further comprising a garage formed in the frame and sized to couple with the slot adapter once separate from the frame.

6. The information handling system of claim 1 wherein:

the first device comprises a first WNIC having a first footprint with a signal interface at a first end and coupled to the device slot with a screw at a second end; and the second device comprises a second WNIC having a second footprint with a signal interface at a first end and coupled to the device slot with a screw at a second end.

7. The information handling system of claim 6 further comprising first and second slot adapters coupled to the frame, the first slot adapter coupling the first WNIC in the device slot with the first footprint, the second slot adapter coupling the second WNIC.

8. The information handling system of claim 6 wherein the slot adapter has first and second structures, the first structure configured to couple the first WNIC in the device slot, the second structure configured to couple the second WNIC in the device slot.

9. The information handling system of claim 8 wherein the slot adapter further comprises an offset post extending down from a bottom surface to align a selected of plural screw openings with a device slot opening based upon the position of a post opening in the device slot.

10. A method for coupling a selected of plural devices in a device slot of an information handling system, the method comprising:

separating a slot adapter from a frame internal to a housing of the information handling system;

placing the slot adapter at a first location in the device slot; and securing a first device having a first footprint in a first device slot supported at least in part by the slot adapter.

11. The method of claim 10 further comprising:

removing the first device from the device slot; and coupling the slot adapter in a slot adapter garage formed in the frame.

12. The method of claim 10 further comprising:

securing a second in the device slot;

wherein the second device has a second footprint of greater than the first footprint.

13. The method of claim 12 wherein the first device comprises a 2230 SSD and the second device comprises a 2280 SSD.

14. The method of claim 12 further comprising:

placing the slot adapter at a second location in the first device slot; and securing the second device in the first device slot supported at least in part by the slot adapter.

15. The method of claim 14 wherein the first and second devices comprise first and second WNICs.

16. The method of claim 15 further comprising:

extending a post from a bottom side of the slot adapter offset from a center position of the slot adapter;

inserting the post in a first opening of the device slot to align a first screw opening of the slot adapter with the first device; and inserting the post in a second opening of the device slot to align a second screw opening of the slot adapter with the second device.

17. A device slot adapter comprising:

a frame configured to couple to an interior of an information handling system housing;

a slot adapter removeably integrated to the frame to separate from the frame and couple to a device slot, the slot adapter having a structure to support a device in the device slot; and a slot adapter garage formed in the frame and configured to couple with the slot adapter after the slot adapter separates from the frame.

18. The device slot adapter of claim 17 further comprising a first structure associated with a first screw opening to support a first device and a second structure associated with a second screw opening to support a second device.

19. The device slot adapter of claim 18 further comprising an alignment post extending down from a bottom surface and offset from a center location to insert in a post opening of device slot having a predetermined alignment.

20. The device slot of claim 19 having four screw openings, each screw opening associated with a different device footprint.

* * * * *

UNITED STATES PATENT AND TRADEMARK OFFICE
CERTIFICATE OF CORRECTION

PATENT NO. : 12,306,674 B2
APPLICATION NO. : 18/228618
DATED : May 20, 2025
INVENTOR(S) : Jing-Tang Wu et al.

Page 1 of 1

It is certified that error appears in the above-identified patent and that said Letters Patent is hereby corrected as shown below:

In the Claims

In Column 8, Line 12, please replace "securing a second in" with --securing a second device in--.

Signed and Sealed this
Nineteenth Day of August, 2025

Coke Morgan Stewart
*Acting Director of the United States Patent and Trademark Office*